(12) United States Patent
Venkatraman et al.

(10) Patent No.: US 8,044,437 B1
(45) Date of Patent: Oct. 25, 2011

(54) INTEGRATED CIRCUIT CELL ARCHITECTURE CONFIGURABLE FOR MEMORY OR LOGIC ELEMENTS

(75) Inventors: Ramnath Venkatraman, San Jose, CA (US); Carl Anthony Monzel, III, Eagan, MN (US); Subramanian Ramesh, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 1330 days.

(21) Appl. No.: 11/130,350

(22) Filed: May 16, 2005

(51) Int. Cl.
*H01L 27/118* (2006.01)
(52) U.S. Cl. ......... 257/206; 257/208; 257/401; 257/903
(58) Field of Classification Search .................. 257/206, 257/903, 904, 208, 401
See application file for complete search history.

(56) References Cited

U.S. PATENT DOCUMENTS

| | | | |
|---|---|---|---|
| 5,854,497 A * | 12/1998 | Hiramoto et al. ............. 257/206 |
| 5,923,059 A | 7/1999 | Gheewala | |
| 5,932,059 A | 8/1999 | Langer et al. | |
| 5,977,574 A | 11/1999 | Schmitt et al. | |
| 6,166,560 A | 12/2000 | Ogura et al. | |
| 6,476,424 B1 * | 11/2002 | Ishida ............................ 257/206 |
| 6,657,243 B2 * | 12/2003 | Kumagai et al. .............. 257/206 |
| RE38,545 E * | 7/2004 | Hiramoto et al. ............. 257/206 |
| 6,791,200 B2 * | 9/2004 | Nii ................. 257/206 |
| 6,842,534 B1 * | 1/2005 | Paz-Pujalt et al. ............. 382/149 |
| 6,974,978 B1 * | 12/2005 | Possley .......................... 257/204 |
| 6,989,687 B2 * | 1/2006 | Or-Bach ......................... 326/38 |
| 2005/0047254 A1 * | 3/2005 | Venkatraman et al. .. 365/230.05 |
| 2005/0145887 A1 * | 7/2005 | Maeno et al. .................. 257/206 |
| 2005/0253287 A1 * | 11/2005 | Liaw ............................. 257/903 |

* cited by examiner

*Primary Examiner* — Steven Loke
*Assistant Examiner* — Earl Taylor

(57) ABSTRACT

An improved integrated circuit cell architecture is provided for configurability between a memory cell or logic elements. The cell architecture is configured on variable layers above a first layer of metal, with the first layer of metal and layers therebelow reserved as fixed layers. By coupling a maximum of two layout cells together, a single-port or dual-port memory cell is realized. Likewise, by interconnecting transistors within a single cell or transistors among two or more cells, a logic device is realized. Within each cell, the bit lines are arranged on a layer separate from the wordlines, and extend orthogonal to each other.

12 Claims, 4 Drawing Sheets

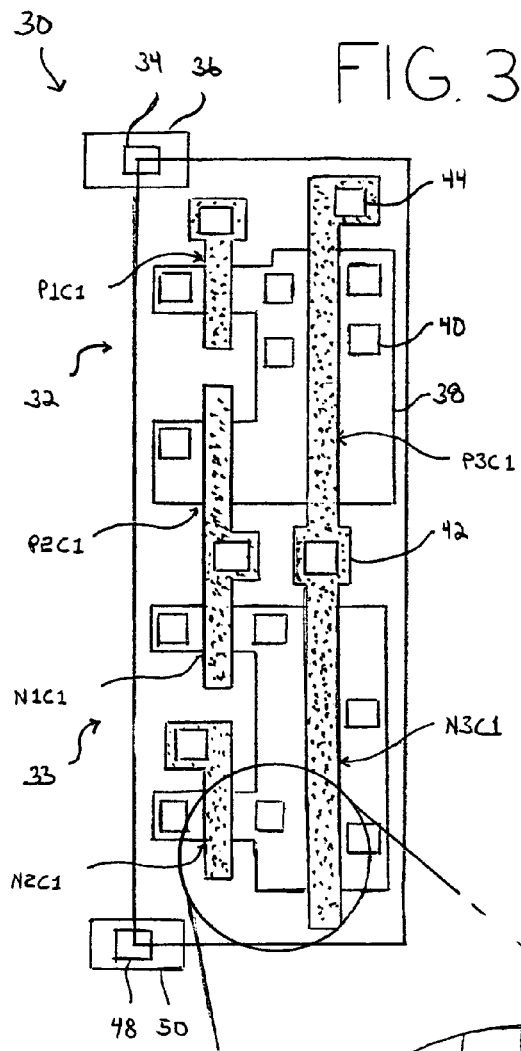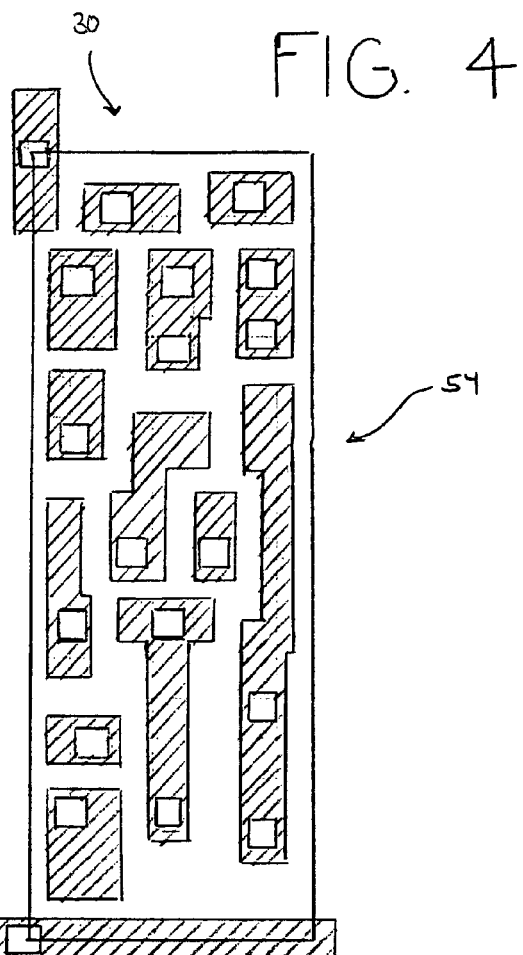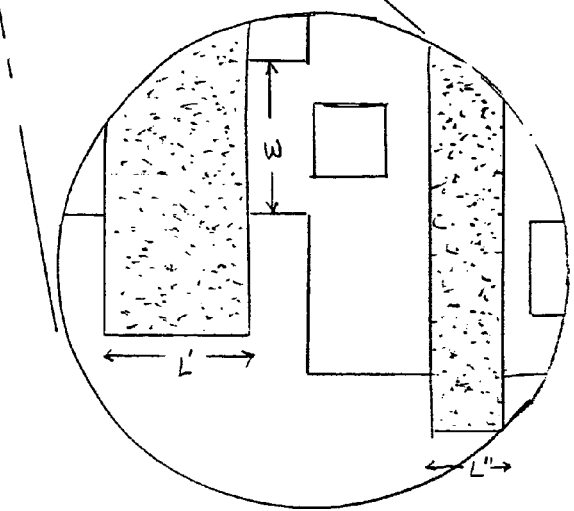

INTEGRATED CIRCUIT CELL ARCHITECTURE CONFIGURABLE FOR MEMORY OR LOGIC ELEMENTS

BACKGROUND OF THE INVENTION

1. Field of the Invention

This invention relates to integrated circuits and, more particularly, to cell based integrated circuit layout architecture that is configurable as a logic device or a single/dual port memory cell using no more than two configurable cells.

2. Description of the Related Art

The following descriptions and examples are not admitted to be prior art by virtue of their inclusion within this section.

An integrated circuit generally comprises the interconnection of various circuit elements. Those circuit elements include transistors, resistors, capacitors, logic gates, flip-flops, registers, etc. In order to achieve functionality, the various circuit elements must be interconnected with attention given to where those elements are relative to each other. For example, performance of the integrated circuit is affected by where the elements are connected, and the interconnect length between elements. Optimal performance of circuit elements upon the integrated circuit substrate is generally dictated by the "layout" of the integrated circuit.

Layout considerations oftentimes depend on a tradeoff between performance and cost. In an application-specific integrated circuit (ASIC), placement of elements and the interconnection therebetween is unique to that particular integrated circuit design. That is, layout is performed on a chip-by-chip basis and cannot be easily modified whenever a design change is needed for that particular product. An ASIC thereby enjoys the benefits of high performance, but also has a fairly high non-recurring expense each time a design change is needed.

At the opposite end of the spectrum from ASIC design is the more versatile gate array concept. A gate array can be designed into a base pattern and thereafter fabricated into an integrated circuit for customer-specific functional requirements. A typical gate array consists of pre-designed circuit units or cells that are wired together to rapidly implement the final integrated circuit functionality. The pre-designed circuit elements are called basic cells that, when interconnected, becomes the macro cell building blocks for the final integrated circuit product. The functionality of the final integrated circuit is thereby dictated by the interconnection of the macro cells, and that interconnection can vary depending on any changes in functionality.

Gate array technology allows the pre-designed circuit unit to be fixed and need not change from one final circuit design to the next. Placement of interconnection that can vary depending on the final result thereby adds configurability (or reconfigurability) to the gate array design. Thus, the concept of "fixed" and "variable" cell design applies to gate array technology to afford a lower non-recurring expense if any design change is needed. The design change can be implemented on the variable fabrication layers, yet the fixed layers will remain the same.

Gate array technology generally allows changes to be made in the field to implement what is known as field-programmable gate arrays (FPGAs). FPGAs unfortunately have lower performance and higher power consumption relative to ASIC designs, yet enjoy a lower non-recurring expense. A special form of ASIC, known as structured ASIC, serve somewhat as a compromise between FPGAs and standard ASICs.

Similar to gate arrays, structured ASICs implement basic cells that are interconnected to form circuit elements. However, structured ASICs are not programmed in the field as in FPGAs, nor do structured ASICs consist of pre-designed circuit elements (e.g., logic gates, flip-flops, registers, etc.) that are wired together to form the integrated circuit. Instead, structured ASIC technology utilizes cells that may contain one or more transistors that are customized by connecting a transistor within one cell to possibly several transistors in another cell, yet all cells of the fixed layers look alike. The variable layers and, specifically, the variable interconnect layers, provide reconfigurability to the structured ASIC.

While structured ASICs have better performance and lower power consumption than gate arrays, and have a lower non-recurring expense relative to standard ASICs, structured ASICs nonetheless have limitations as to what type of integrated circuit they can form. With the advent of greater integration and the use of system-on-chip (SoC) technology, modern design places as many subsystems on the integrated circuit as possible. One such popular subsystem includes semiconductor memory. Conventional structured ASICs are generally limited to fixed layers of transistors that are thereafter interconnected through variable layers to form logic circuits, such as NAND gates, NOR gates, etc. Unfortunately, modern SoCs mandate that the final integrated circuit contain more than just logic gates.

It would be desirable to implement a structured ASIC that can be reconfigured as logic gates, registers, flip-flops, and all other logic circuitry, as well as or in addition to memory. It would also be desirable to introduce a structured ASIC that can achieve a single port or dual port memory cell using a minimum number of ASIC cells. If the final memory density is to be feasible, the desired circuit layout architecture must contain the necessary building blocks for logic as well as memory within a minimum number of layout cells that repeat as a fabric or array across the integrated circuit.

SUMMARY OF THE INVENTION

The problems outlined above are in large part addressed by an improved circuit layout architecture that utilizes an array of layout cells. The layout cells can be processed up through a particular fabrication step to produce fixed layers within each cell of the array. The fixed layers will thereby remain fixed even though the final integrated circuit design will change. Reconfiguration is achieved by modifying the variable layers that come subsequent to the fixed layers in the fabrication sequence.

The improved layout architecture can achieve interconnection of transistors having different sizes within each layout cell. Moreover, interconnection can be achieved across cells to form basic logic gates as well as more complex digital and analog subsystems. In addition, each cell contains a layout of transistors that can be variably coupled to achieve a memory cell. In particular, the memory cell can comprise a cross-coupled pair of transistors that form a latch, with pass transistors or access transistors to that latch. Preferably, no more than two cells are needed to achieve either a single-port static random access memory (SRAM) cell or a dual-port SRAM cell. By having the capability of forming either a logic circuit element, a memory cell, or both within as few as two cells preferably arranged side-by-side, the present improved layout architecture is both memory- and logic-centric, and more fully adaptable to modern-day SoCs. Moreover, this improved layout architecture has the benefits of gate array technology with lower non-recurring expenses, yet benefits from higher performance and lower power consumption associated with standard ASIC technology.

According to one embodiment, a configurable circuit layout architecture is provided. The architecture comprises a pair of cells arranged adjacent each other and comprising a set of transistors configured as either a logic device or a memory device. Within each cell is at least one transistor that has a relatively short gate width and another transistor that has a relatively long gate width. Moreover, the transistors can have differing gate lengths. The gate widths and lengths can be formed within the fixed layers as part of the fixed layer geometries. Depending on which transistor is being used, either the shorter or longer gate width transistors can be used when interconnected with adjacent cell transistors to form a SRAM memory cell with pass gates, pull-up transistors and pull-down transistors. Alternatively, the differing gate width transistors can be interconnected to form inverters, for example, of differing sizes such as would be needed when forming a large inverter buffer or a smaller inverter used in logic circuits.

According to an alternative embodiment, a dual-port memory cell is provided. The memory cell includes a pair of layout cells arranged adjacent to each other and comprising a fixed set of patterned layers and contacts below and inclusive of a first layer of metal interconnect. The fixed set of patterned layers are substantially identical to each other within each of the pair of layout cells. Moreover, the fixed set of layers, as well the processing steps needed to form the fixed layers, implant regions, processing steps in general, do not change if the overall design should change. The memory cell also includes a second layer of metal interconnect dielectrically spaced above the first layer of metal interconnect. Part of the second layer of metal, or vias to the second layer of metal, can change if the design changes. Moreover, the second layer of metal and second metal vias are variable and can be dissimilar from each other within each of the pair of layout cells. A second layer of metal can comprise two complementary pairs of bit lines extending in a first direction. The memory cell also includes a third layer of metal interconnect dielectrically spaced above the second layer of metal interconnect. The third layer of metal or vias thereto is variable and dissimilar from each other within each of the pair of layout cells. The third layer of metal comprises a first wordline and a second wordline extending in a second direction perpendicular to the first direction. The second layer of metal can comprise a ground supply extending in a first direction and coupled to a p-channel well region at a corner of each of the pair of layout cells. The third layer of metal can also comprise a power supply extending in the second direction and coupled to a n-channel well region at a corner of each of the pair of layout cells.

According to yet another embodiment, a method is provided for forming an integrated circuit. The method includes providing a substrate resulting from a set of fabrication steps up to and inclusive of a first metal interconnect layer. Thereafter, a first set of vias are formed through a dielectric overlying the first metal interconnect layer. A second metal interconnect layer is then formed comprising at least one complementary pair of bit lines along a first direction onto a subset of the first set of vias. A second set of vias is then formed through a dielectric overlying the second metal interconnect layer. At least one wordline is then formed along a second direction onto a subset of the second set of vias.

BRIEF DESCRIPTION OF THE DRAWINGS

Other objects and advantages of the invention will become apparent upon reading the following detailed description and upon reference to the accompanying drawings in which:

FIG. 3 is a top view of a cell layout, showing the diffusion, polysilicon and contact to metal 1 fixed layers;

FIG. 4 is a top view of the cell layout in FIG. 3, showing the contact to first metal and first metal fixed layers;

FIG. 5 is a detail view of a gate length and width of a transistor used as a pass transistor in a SRAM memory cell with variable gate length and width compared to the pull-up and pull-down transistors of the SRAM memory cell;

Figure 1:
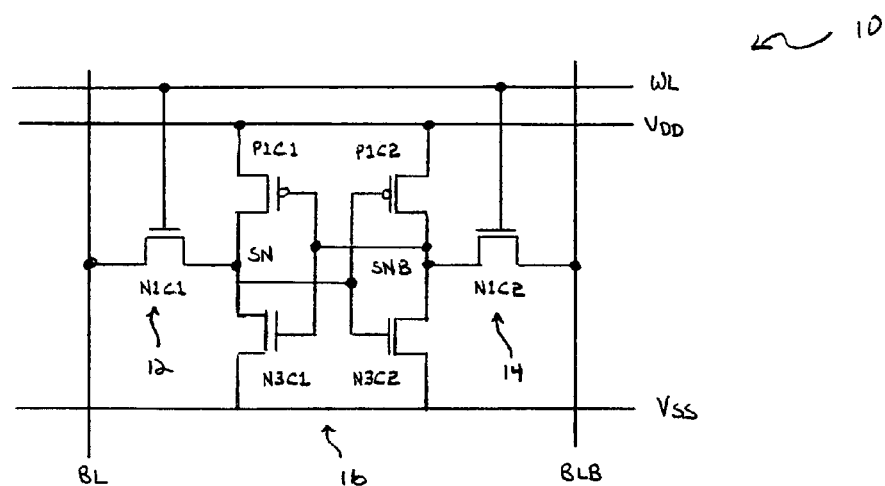
FIG. 1 is a circuit schematic diagram of a single-port memory cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a memory cell 10. Memory cell 10 is shown as a SRAM cell. However, it is contemplated that the use of the term "memory cell" includes any type of memory cell that can receive written logic values and transmit read logic values that are stored in the interim. Popular forms of memory cells include SRAM, non-volatile cells, DRAM, etc.

Memory cell 10 can be accessed by applying a voltage to the wordline (WL) which activates access transistors 12 and 14. Accessing transistors 12 and 14 will cause one of two bit lines BL or BLB to sense the contents of the memory cell based on the voltages present at the storage nodes SN and SNB. For example, if storage node SN is at a high logic value and node SNB is at a low logic value when the wordline is raised, the cross-coupled pairs of inverters 16 read out the latched values at SN and SNB onto bit lines BL and BLB. The state of the memory cell (either a logic 1 or a logic 0 voltage value) can be determined or read by sensing the potential difference between bit lines BL and BLB. Conversely, writing a logic 1 or logic 0 into the memory cell can be accomplished by forcing the bit line or bit line complement to either $V_{DD}$ or $V_{SS}$, and then raising the wordline WL. The potentials placed on the pair of bit lines will be transferred to respective storage nodes SN and SNB.

Figure 2:
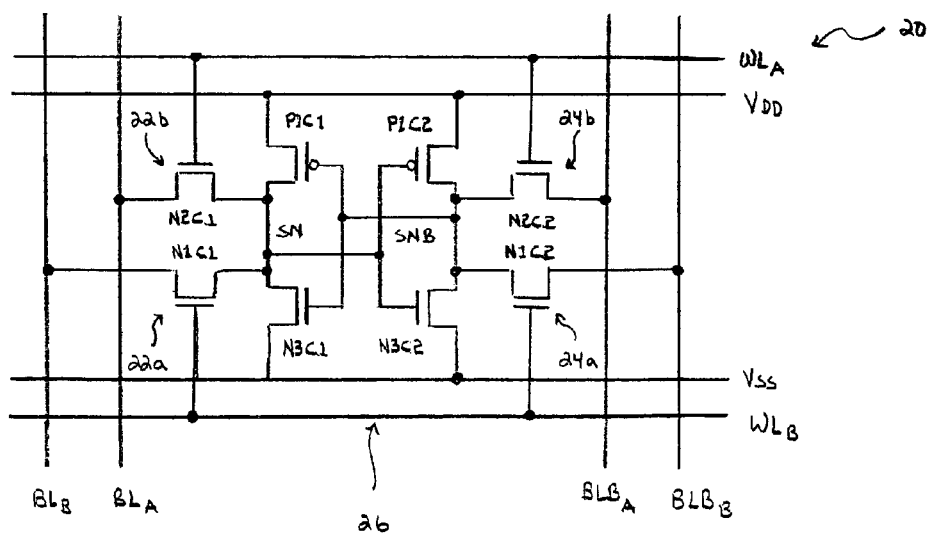
FIG. 2 is a circuit schematic diagram of a dual-port memory cell.

The memory cell 10 of FIG. 1 is referred to as a single-port memory cell. There are some applications in SoC designs that benefit from use of dual-port memory cells. A dual-port memory cell allows two independent devices (e.g., electronic subsystems such as dual processors) to have simultaneous read and/or write access to memory cells within the same row or column. Dual-port memory cells are somewhat similar to single-port memory cells, except that each cell contains two wordlines and two pairs of true and complementary bit lines. A dual-port memory cell 20 is shown in FIG. 2.

Each port of the dual-port memory cell 20 utilizes a pair of bidirectional ports referred to as port A and port B. Cell 20 is shown having two more access transistors beyond that of cell 10 (FIG. 1). One wordline $WL_A$ or $WL_B$ is used for accessing each port. Two pairs of bit lines $BL_A/BL_B$ and $BLB_A/BLB_B$ are provided for reading/writing to the nodes of the storage elements SN and SNB. Thus, in addition to the six transistors described for a single-port memory cell 10, dual-port memory cell 20 is shown having another pair of access transistors thereby totaling eight transistors. Of the eight transistors, there are two pairs of access transistors 22a/22b and 24a/24b, along with two pairs of cross-coupled inverters 26.

While dual-port memory allows each subsystem access to the bit lines and wordlines (i.e., to the array) through its dedicated port, a problem might occur, however, when two or more subsystems access the same addressable location (cell) at the same time. Specifically, a problem arises whenever those accesses involve a write operation. Proper timing of the multiple write accesses or multiple read/write accesses must be determined and a convention set to guarantee data integrity. Thus, while multi-port memories benefit and offer simultaneous write accesses to different portions of memory or even read accesses to the same portion, multi-port memories remain restrictive when simultaneously accessing the same cell or memory location. In those instances, an arbitration scheme is typically designed to prevent writing over valid data or reading invalid data. The benefits of accessing the array by multiple subsystems certainly outweighs the detriments of having to arbitrate when accessing the same memory location or cell. Accordingly, dual-port and multi-port memories have gained popularity beyond single-port memories.

The benefits of dual-port memory is more readily achieved if a layout cell can be designed that is adaptable to being configured as a dual-port memory with minimum real estate consumption. Moreover, the layout cell must also be adaptable to non-memory-centric designs—e.g., standard logic cell designs. The circuit cell architecture or layout is one that preferably follows a structured ASIC technology for maximum performance and minimum power consumption, yet benefits from a lower non-recurring expense compared to standard ASIC technology.

To achieve the benefit of a structured ASIC, the layout cell architecture can be designed as building blocks, with each cell laid side-by-side with one another. The fixed layers of each cell do not change across the wafer and, thus, across each diced integrated circuit. The variable layers arrive much later in the fabrication sequence, and do change depending on the final integrated circuit configuration. Thus, a dual-port memory can be envisioned with relatively few variable layers later in the fabrication sequence. The same can be said for configuring a standard logic device. This allows a stockpiling of wafers containing fixed layers, beginning with bare substrate or silicon and continuing through the implant, diffusion, deposition, etch, etc. cycles, through the first metal layer dielectrically spaced over polysilicon local interconnect and gate conductors. The first metal layer has associated contacts that extend from that metal layer to the underlying diffusion, local interconnect, and gate conductors. The fixed layers thereby include all processing steps such as the formation of layers through and including the first metal layer and contacts extending from the first metal layer downward to conductive regions.

FIG. 3 illustrates a layout cell 30 made up of fixed layers. Cell 30 can be formed side-by-side with other cells across the wafer, and if the circuit is a CMOS circuit, the cell typically consists of a set of n-channel transistors and p-channel transistors. The p-channel transistors 32 are within an n-well that receives contact at a corner 34 through the diffusion region 36. Similarly, the n-channel transistors 33 are within a p-well that receives contact at corner 48 through the diffusion region 50. Diffusion 36/50 can be contacted through another via rising up from diffusion 36/50 to a first metal or possibly a third metal that contains a power/ground conductor. Cell 30 thereby includes all of the different processing steps, but for sake of brevity, shows only diffusion 36, 38 and 50, contacts 40 from diffusion upward, polysilicon 42, and contact 44 from polysilicon upward. Diffusion 38 can be a P+ diffusion in the upper region of FIG. 3 to form corresponding p-channel transistors, and can be a N+ diffusion in the lower region of FIG. 3 to form corresponding n-channel transistors, or viceversa. in order to produce p-channel transistors within diffusion 38 Polysilicon is shown with dots contained within the boundary of the patterned polysilicon, and overlies diffusions to form transistors.

Using FIGS. 1 and 3 in combination, the transistors within the first cell C1 are labeled and mimicked in the second cell C2. Thus, cell 30 is illustrated as the first cell C1, and another cell next to cell 30 will be referenced as cell C2. The horizontal and vertical dimensions of each layout cell are an integral multiple of the routing grid, which is typically equal to the metal pitch offered for the particular layout technology. In addition to its use in forming the basic logic elements, such as logic gates, flip-flops, registers, and the like, the layout cell addresses the formation of memory cells as well. The memory cells can be single- and dual-port memory cells. The benefits of being able to configure each layout cell as a memory cell or logic gate is particularly helpful given the increased demand for use in dual-port memories, for example, in structured ASICs having logic elements contained on the same integrated circuit as the memory cells.

Each cell 30 can contain transistors of differing gate widths. For example, the pull-down transistor N3C1 has a longer gate width than transistor N2C1 or transistor N1C1. This is particularly useful when applying the pull-down transistor to one of the n-channel pull-down transistors of a memory cell, with the smaller transistors reserved for the access transistors. Of the p-channel transistors, transistor P3C1 can be used as the load or pull-up transistor in the memory cell, with all other p-channel transistors being used possibly in the construction of logic gates.

The transistor sizes N3C1 and N1C1/N2C1 can be chosen to maximize the read margin and static noise margin of, for example, an SRAM cell. Also, in addition to the n-well tap/contact 34 and diffusion 36, a p-well tap 48 and diffusion 50 is provided at another corner of cell 30. Each tap is shared by four adjacent cells to allow a single contact to wells of four cells that are joined with one another at the corresponding cell corner.

The fixed layers of cell 30 are optimized to provide subsequent routability of the cell for forming either standard logic gates or single/dual-port memory cells. For example, if a cell is to be configured as a NAND gate, the parallel-coupled p-channel transistors P1C1 and P2C1 are readily available if so connected. Moreover, the series-connected n-channel transistors can utilize N1C1 and N2C1 by coupling those transistors in series. In addition, cell 30 can be configured as having an inverter optimally laid out using transistors N1C1 and P2C1 or, alternatively, if a larger inverter is needed (possibly in a buffer), transistors N3C1 and P3C1 can be used. In the fixed patterned polysilicon layer, gate lengths can be varied as shown in the detailed, blow-up illustration of FIG. 5. For example, the gate length of transistor N2C1 can be increased beyond the gate length of transistor N3C1 by comparing L' to L".

It may be advantageous in dual-port SRAM memory design that the ratio of the strength (gate width/gate length) values of the larger n-channel transistor N3C1 to that of the smaller n-channel transistor N2C1/N1C1 be between 3 and 4. For single-port SRAM design, the ratio is preferably between 1.5 and 2. This is known as the beta ratio of the SRAM. Increasing the beta ratio means either decreasing the gate width of transistor N2C1 compared to N3C1, or increasing the gate length of transistor N2C1 relative to transistor N3C1. In some instances, it is desirable to increase the channel length of the smaller n-channel device by making it larger than the minimum allowed channel length of the design rules and, thus, larger than the channel length of the larger n-channel device. This helps to reduce bit line leakage of the SRAM array. Also, by increasing the channel length of the smaller n-channel device, an improvement in the stability of the cell and a reduction in the variability of the bit line leakage can be accomplished. This is primarily due to the ease (and repeatability) by which larger channel lengths can be accomplished. Analysis can be done to determine how large to make the channel length in order to reduce bit line leakage on each bit line, yet not to significantly degrade the access times. As shown in FIG. 5, the fixed layers can be designed with optimal gate lengths and widths and stockpiled. The subsequent variable layers need not consider the pre-designed and pre-manufactured fixed layers that take into account optimal gate lengths and gate widths for each of the various transistors, whether used as a logic device or as a memory cell.

FIG. 4 illustrates the contact structures rising from the diffusion region 38 and polysilicon conductors 42 of FIG. 3 upward to the first layer of patterned metal. The patterned metal is shown as cross-hatched members 54. The first layer of metal extends over contacts that go through dielectric and downward to the diffusion regions or polysilicon regions. Similar to polysilicon, contacts, and underlying diffusion regions, the first layer of metal 54 is fixed in its geometry from cell-to-cell. The purpose of the fixed layer of first metal interconnect is to extend the conductive area laterally so as to make contact with possibly a upper-level via and second (or third) metal layers extending over that via. The second and third metal layers and vias between the first metal layer and the second metal layer, or the vias between the second metal layer and the third metal layer provide routability and, thus, configurability to elements within the cell as well as elements between cells to form a logic element or a memory cell.

Figure 6:
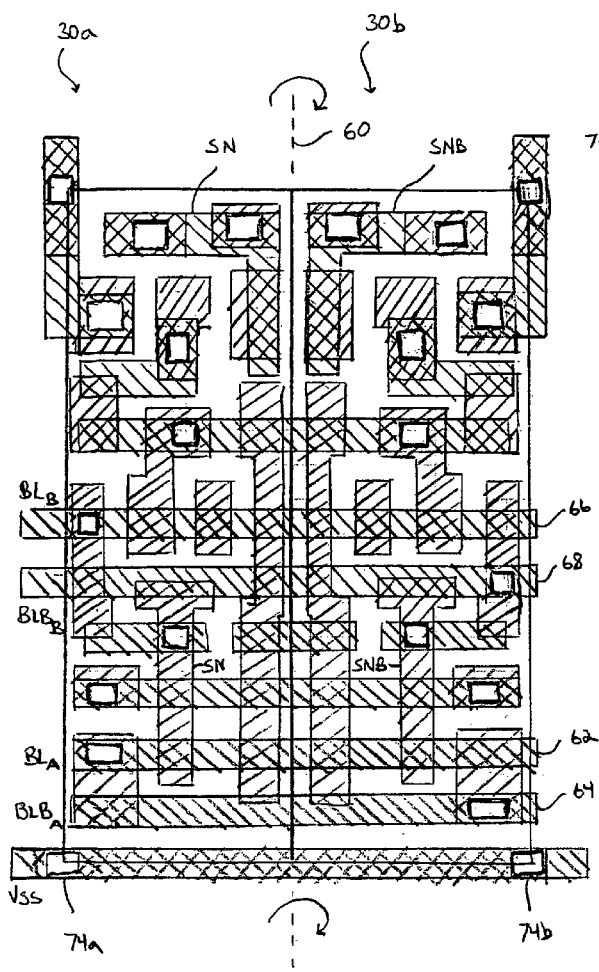
FIG. 6 is a top view of two cells of FIG. 4 with the added via from first metal to second metal and second metal variable layers.

Referring to FIG. 6, two cells 30a and 30b are placed side-by-side with cell 30b shown rotated about its vertical axis 60 relative to cell 30a. The combination of cells 30a and 30b are shown to form a dual-port SRAM memory cell. Specifically, FIG. 6 illustrates the bit lines which connect to the access transistors. When comparing FIGS. 3, 4, and 6, $BL_A$ connects to the drain of transistor N2C1 and extends across adjacent cells along conductor 62. The complementary bit line $BLB_A$ connects to transistor N2C2 and extends along the conductor 64. Conductors 62 and 64 are on the second layer of metal coupled to the first layer of metal through vias as shown. Bit line $BL_B$ connects to transistor N1C1 and extends along the second layer of metal through conductor 66, while bit line $BLB_B$ connects to transistor N1C2 and extends along conductor 68. Thus, the second layer of metal is shown in cross-hatch at −45° relative to the first layer of metal which is shown in cross-hatch at +45°. The sense nodes SN and SNB are coupled through the first layer of metal to the second layer of metal. The sense nodes reside on the second layer of metal until further coupled together as shown in FIG. 7.

Figure 7:
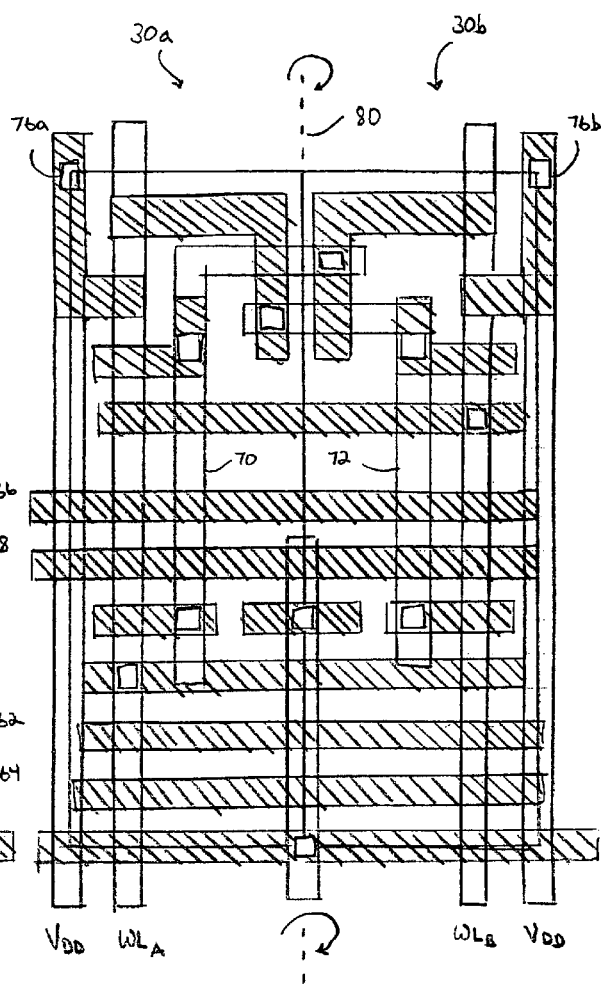
FIG. 7 is a top view of the two cells of FIG. 6 with the added via from second metal to third metal and third metal variable layers.

Referring to FIG. 7, the wordlines $WL_A$ and $WL_B$ for a dual-port memory commensurate with the dual-port memory pair of cells 30a and 30b are shown. The sense nodes SN and SNB are coupled together on a third layer of metal 70 and 72, respectively. The third layer of metal is shown not having any cross-hatch, with vias extending downward through the second layer of metal which then might be connected to the first layer of metal, and so forth. Wordline $WL_A$ is coupled downward to the second layer of metal through a single via, yet the second layer of metal extends horizontally and then downward to a first layer of metal through the pair of vias shown in FIG. 6. The first layer of metal is connected to the polysilicon gate conductor of transistors N2C1 and N2C2. Similarly, the wordline $WL_B$ connects through a single via to the second layer of metal, which then connects to a first layer of metal coupled to the gate conductors of transistors N1C1 and N1C2.

Comparing FIGS. 6 and 7, the ground supply conductor $V_{ss}$ is shown in FIG. 6 coupled to the p-well at contacts 74a and 74b. The power supply conductor is coupled to the contacts 76a and 76b at the n-well regions. The bit lines thereby extend along the second layer of metal from cell-to-cell possibly across the entire array. Similarly, the wordlines extend along the third layer of metal from cell-to-cell possibly along the entire array. The power and supply conductors also extend from cell-to-cell possibly along the entire array. As shown, bit lines and ground supply conductors extend along the rows of adjacent cells for each row of the array, and the wordline and power supply conductors extend along each column of the array. FIG. 7 thereby represents the same pair of cells as FIG. 6, with the second cell 30b being rotated along an axis 80 relative to its vertical axis, and placed side-by-side with cell 30a. Thus, cells 30a and 30b are identical to one another, yet rotated as a reflected image of each other.

FIGS. 6 and 7 illustrate how the fixed and variable layers form a dual-port memory cell with independent read and write ports using only two layout cells 30a and 30b. Transistors are connected to have bit lines extending along the second layer of metal in a horizontal direction, and the wordlines running vertically along the third layer of metal. Bit lines on the second layer of metal rather than the third layer of metal proves advantageous in reducing the bit line capacitance and adding flexibility for use of the upper layer metals, such as metal four and higher, for global routing. If the bit lines are used on the third layer of metal, the memory area would be too congested for dense layout given that the wordlines are also on the third layer of metal—thus, requiring an increased chip area, cost, and routing congestion.

Each of the transistors within each cell are shown having independent terminals. More specifically, when referring to FIGS. 3 and 4, each of the six transistors has a drain output that can be coupled independent and separate from the drain outputs of the other transistors. For example, the drain output of transistor N3C1 can be on the right-hand side, whereas the drain output of transistors N1C1 and N2C1 can be on the left-hand side of the respective polysilicon gates. Each transistor thereby can be coupled separate and independent of the other transistors, rendering those six possible transistor connections independent of each other. Thus, there can be a possible connection in which no shared terminals occur between transistors.

Figure 8:
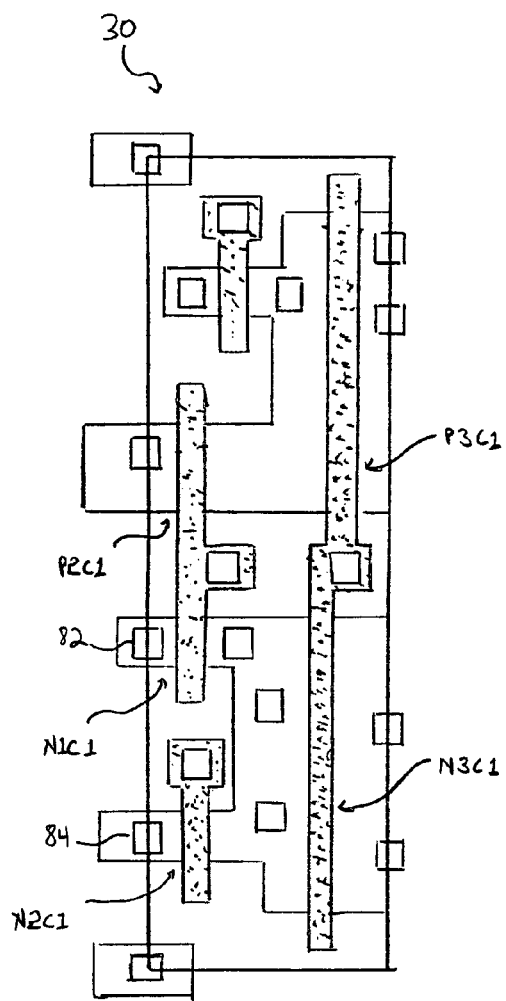
FIG. 8 is a top view of FIG. 3 compressed in a horizontal direction according to a smaller cell size alternative embodiment.
Figure 9:
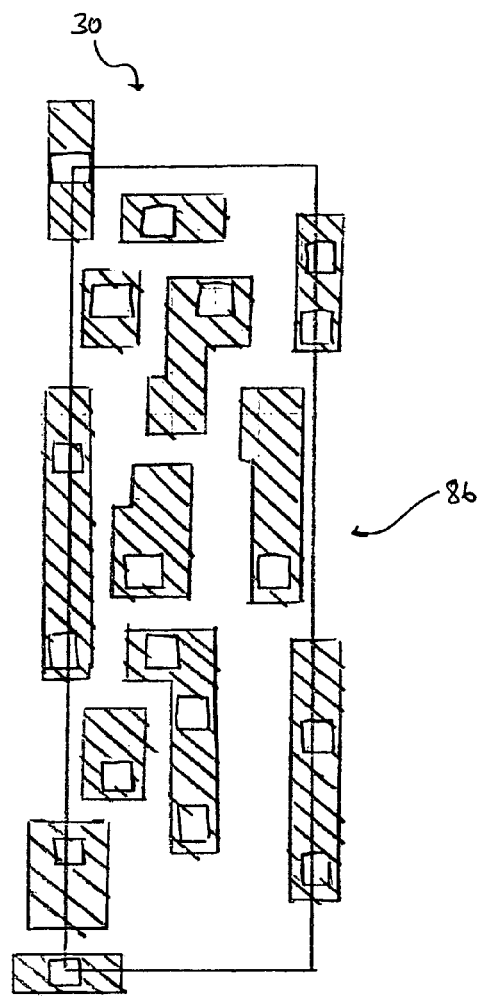
FIG. 9 is a top view of FIG. 4 compressed in a horizontal direction according to the alternative embodiment.

In possibly another embodiment shown in FIGS. 8 and 9, the drain (or source) regions of transistors N1C1 and N2C1 can be shared between adjacent cells given the location of contacts 82 and 84. In addition, the drain (or source) of the larger n-channel transistor N3C1 can also be shared with that of the corresponding transistor in the adjacent cell. FIG. 9 illustrates the layout of first layer of metal 86 and the contacts downward to the underlying polysilicon or diffusion regions. Similar to the first of layer of metal shown in FIG. 4, layer 86 indicates a cross-hatching indicative of metal. Therefore, cell 30 of FIG. 8 is represented as the polysilicon, diffusion, and contact regions, whereas cell 30 of FIG. 9 is the overlying metal one regions. FIGS. 8 and 9 illustrate in this embodiment that the horizontal dimension can be reduced if the design allows for non-independent terminals for the transistors shown having a contact which is shared with the adjacent cell. In this example, since the contacts of transistors P2C1, P3C1, N1C1, N2C1, and N3C1 are shared with the adjacent cell, the independent connection to those transistors is lost. However, the overall horizontal dimension of the cell 30 of FIGS. 8 and 9 is less than that of cell 30 is FIGS. 3 and 4.

The combination of two cells interconnected help form a dual-port SRAM cell with no restrictions on column muxing or bit write capability. Both ports employ differential sensing of the bit lines during read. The bit lines are formed horizontal to the wordlines, and the spacing between the true and complementary bit lines A and B is increased to prevent capacitive coupling of the differential logic values residing on those bit lines. Thus, as shown in FIG. 6, $BL_A$ is spaced considerably from $BL_B$ by intervening conductors placed on the same metal layer as the second metal layer which accommodates the bit lines. This eliminates cross-talk and capacitive coupling between bit lines on separate ports. Thus, if a logic value is written to one port through $BL_A$, the present layout prevents disruption of a read on another cell via $BL_B$ due to capacitive coupling. Noting that $BL_A$ and $BL_B$ are very long and extend across many memory cells, reduction in capacitive coupling is beneficial.

It will be readily apparent to those skilled in the art when reviewing the circuit schematic of FIGS. 1 and 2, that either a single-port or a dual-port memory cell can be formed from two layout cells given the benefit of this description. A skilled artisan would know the various interconnections through vias between metal and contacts between the first layer of metal downward to form the circuit schematic of FIGS. 1 and 2, given the benefit of FIGS. 3-7 and the alternative embodiment of FIGS. 8 and 9.

It will be appreciated to those skilled in the art having the benefit of this disclosure that this invention is believed to provide an improved layout architecture that offers substantial flexibility in forming either a logic device or a memory cell using only variable layers above the first layer of metal. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A configurable circuit layout architecture, comprising a pair of cells arranged adjacent each other and having a set of transistors selectively configured as either a logic device or a single, dual port memory device by modifying layers above a first layer of metal interconnect, with a portion of the dual port memory device confined within one of the pair of cells, and the remaining portion of the dual port memory device confined within the other one of the pair of cells.

2. The circuit layout architecture as recited in claim 1, wherein one cell of the pair of cells is rotated about a vertical axis and then arranged side-by-side with the other cell of the pair of cells.

3. The circuit layout architecture as recited in claim 1, wherein the pair of cells below and inclusive of the first layer of metal are identical to each other.

4. The circuit layout architecture as recited in claim 1, wherein the set of transistors within each of the pair of cells comprise a first n-channel transistor sharing a polysilicon gate arranged along a first single axis with a second p-channel transistor and further comprises a third n-channel transistor sharing another polysilicon gate arranged along a second single axis with a third p-channel transistor.

5. The circuit layout architecture as recited in claim 1, wherein the set of transistors each comprise a gate conductor extending along a direction mutual to all gate conductors.

6. The circuit layout architecture as recited in claim 1, wherein a first re-channel transistor within each respective one of the pair of cells comprises a pair of pass transistors within a static random access memory cell.

7. The circuit layout architecture as recited in claim 6, wherein a third re-channel transistor within each respective one of the pair of cells comprises a cross-coupled pair of pull-down transistors within the static random access memory cell.

8. The circuit layout architecture as recited in claim 7, wherein a third p-channel transistor within each respective one of the pair of cells comprises a cross-coupled pair of pull-up transistors within the static random access memory cell.

9. The circuit layout architecture as recited in claim 1, wherein the logic device is selected from the group consisting of an inverter, a buffer, a logic gate, and a single transistor.

10. The circuit layout architecture as recited in claim 1, wherein the set of transistors within each cell comprises a pair of n-channel transistors coupled between a sense node and a complementary pair of bit lines within the dual port memory device.

11. The circuit layout architecture as recited in claim 10, wherein the pair of n-channel transistors comprises a gate length greater than and a gate width less than at least one other re-channel transistor within each cell.

12. The circuit layout architecture as recited in claim 1, wherein at least two transistors of the set of transistors comprise a pair of terminals coupled to at least two transistors of a set of transistors within the adjacent cell.

* * * * *